(12) United States Patent
Park

(10) Patent No.: US 8,941,604 B2
(45) Date of Patent: Jan. 27, 2015

(54) TOUCH WINDOW OBTAINING COORDINATE POSITION ON BOUNDARY PORTION OF VIEW AREA AND METHOD THEREOF

(75) Inventor: Jin Won Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 291 days.

(21) Appl. No.: 13/362,111

(22) Filed: Jan. 31, 2012

(65) Prior Publication Data

US 2012/0194459 A1 Aug. 2, 2012

(30) Foreign Application Priority Data

Jan. 31, 2011 (KR) ........................ 10-2011-0009419

(51) Int. Cl.
*G06F 3/041* (2006.01)
*G06F 3/044* (2006.01)
*H03K 17/96* (2006.01)

(52) U.S. Cl.
CPC .............. *G06F 3/0418* (2013.01); *G06F 3/044* (2013.01); *H03K 2017/9602* (2013.01); *H03K 2217/960755* (2013.01)
USPC ....................................... 345/173

(58) Field of Classification Search
CPC combination set(s) only.
See application file for complete search history.

(56) References Cited

U.S. PATENT DOCUMENTS 8,550,991 B2 * 10/2013 Nam .............................. 600/202
2014/0050840 A1 * 2/2014 Byun ............................. 427/122

FOREIGN PATENT DOCUMENTS

| JP | 2005-301669 A | 10/2005 |
| JP | 2010-061425 A | 3/2010 |
| JP | 2010-128676 A | 6/2010 |
| JP | 2010-176328 A | 8/2010 |
| JP | 2010-231186 A | 10/2010 |
| JP | 2010-257178 A | 11/2010 |
| KR | 10-2011-0007497 A | 1/2011 |

OTHER PUBLICATIONS

Adachi Masaya JP 2010-061425 Mar. 18, 2010 Touch panel and display device using the same.*

* cited by examiner

*Primary Examiner* — Van Chow
(74) *Attorney, Agent, or Firm* — Saliwanchik, Lloyd & Eisenschenk

(57) ABSTRACT

Provided is a touch window including an upper substrate including a first extension portion from which a first transparent electrode having a first pattern in one direction is extended to an outside of the boundary portion of a view area, and a lower substrate including a second extension portion from which a second transparent electrode having a second pattern in orthogonal direction to the one direction is extended to an outside of the boundary portion of a view area in the orthogonal direction.

12 Claims, 4 Drawing Sheets

TOUCH WINDOW OBTAINING COORDINATE POSITION ON BOUNDARY PORTION OF VIEW AREA AND METHOD THEREOF

CROSS-REFERENCE TO RELATED APPLICATION

This application claims the benefit under 35 U.S.C. §119 of Korean Patent Application No. 10-2011-0009419, filed Jan. 31, 2011, which is hereby incorporated by reference in its entirety.

BACKGROUND

1. Field of the Invention

The present invention relates to a proposal for obtaining a coordinate position on a boundary portion of a view area.

2. Description of the Related Art

In a prior touch window, there has been a case that a touch position is not sensed accurately even within a view area VA where the touch and display are possible.

FIG. 1 is a view showing an example for sensing a coordinate on a boundary portion of a view area VA in a touch window according to a prior art.

As shown in FIG. 1, in the prior touch window, a transparent electrode T1 connected to a metal wire L1 is formed on a boundary portion of a view area VA. However, in the boundary portion of the view area VA, a touch point P11 to be touched really and a recognition point P21 to recognized based on capacitance variation are shown differently.

That is, since as an area of the transparent electrode T1 decreases gradually from the boundary portion of the view area VA to an external part (outward), a sensing degree is decreased to produce a coordinate tilting. Accordingly, the touch point P11 touched practically and the recognition point P21 differ to result in inconsistency in the coordinate recognized by a touch window.

BRIEF SUMMARY

An object of the present invention relates to provide a touch window and a designing method thereof, capable of obtaining the boundary portion coordinate position, in which the touch coordinate position by a user in the boundary portion of the view area is corresponded to the recognition coordinate position, and thus the accurate touch coordinate position is obtained.

Further, another object of the present invention relates to provide a touch window and a designing method thereof, capable of obtaining the boundary portion coordinate position, in which an area of the transparent electrode is enlarged to an outer side of the boundary portion of the view area to improve a touch sensing degree and to prohibit the coordinate tilting.

A touch window comprises an upper substrate including a first extension portion from which a first transparent electrode having a first pattern in one direction is extended to an outside of the boundary portion of a view area, and a lower substrate including a second extension portion from which a second transparent electrode having a second pattern in orthogonal direction to the one direction is extended to an outside of the boundary portion of a view area in the orthogonal direction.

The first extension portion has same area as the inner area of the first transparent electrode formed on the boundary portion of the view area, or may have a larger area than that of the inner area of the first transparent electrode.

The first extension portion is formed along an upper side or a lower side of the boundary portion of the view area and when the upper side or the lower side are touched, the coordinate position of the boundary portion, corresponding to the touch, is obtained.

The second extension portion has same area as the inner area of the second transparent electrode formed on the boundary portion of the view area in an orthogonal direction, or may have a larger area than that of the inner area of the second transparent electrode.

The second extension portion is formed along a left side or a right side of the boundary portion of the view area and when the boundary portion on the left side or the right side are touched, the coordinate position of the boundary portion, corresponding to the touch, is obtained.

The first transparent electrode or the second transparent electrode is formed of one selected from ITO, IZO, ZnO, carbon nano tube, Ag Nano wire, conductive polymer and Graphene.

The first pattern is shaped as at lest one of a circle, semi-circle, quadrangle, polygonal, and lenticular form, and the formed shapes are patterns connected to each other vertically.

The second pattern has same shape as the first pattern and is formed orthogonally to the first pattern.

The touch window further includes a metal wire which is formed on one side of the first extension portion 140 and is connected to the first extension portion and draws the touch signal, corresponding the touch, when the boundary portion of the view area VA is touched.

The upper substrate or the lower substrate is made of one of PET, PC, PES, PI and PMMA.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION

Figure 1:
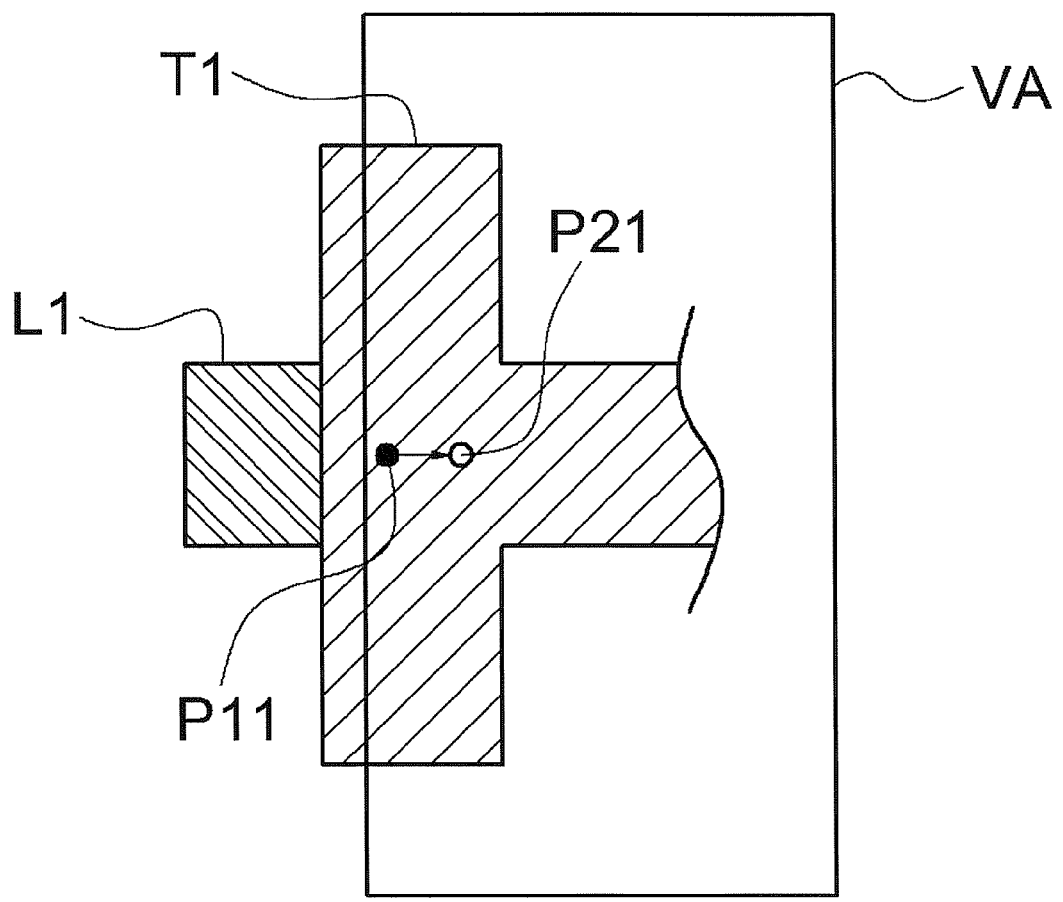
FIG. 1 is a view showing an example for sensing a coordinate on a boundary portion of a view area in a touch window according to a prior art.

Exemplary embodiments of the present invention will be described below in detail with reference to the accompanying drawings. Wherever possible, the same reference numerals will be used to refer to the same elements throughout the specification, and a duplicated description thereof will be omitted.

A touch window of a capacitance type according to the present invention may include an upper substrate 100 and a lower substrate 200 placed under the upper substrate for obtaining a plain coordinate position. In more detail, the touch window includes the upper substrate comprising a first extension portion from which a first transparent electrode is extended to an outside of the boundary portion of a view area VA, and a lower substrate comprising a second extension portion from which a second transparent electrode is extended to an outside of the boundary portion of a view area VA, and thus a touch sensing degree on the boundary portion of the view area VA.

Firstly, the upper substrate will be described, referring to FIG. 2.

Figure 2:
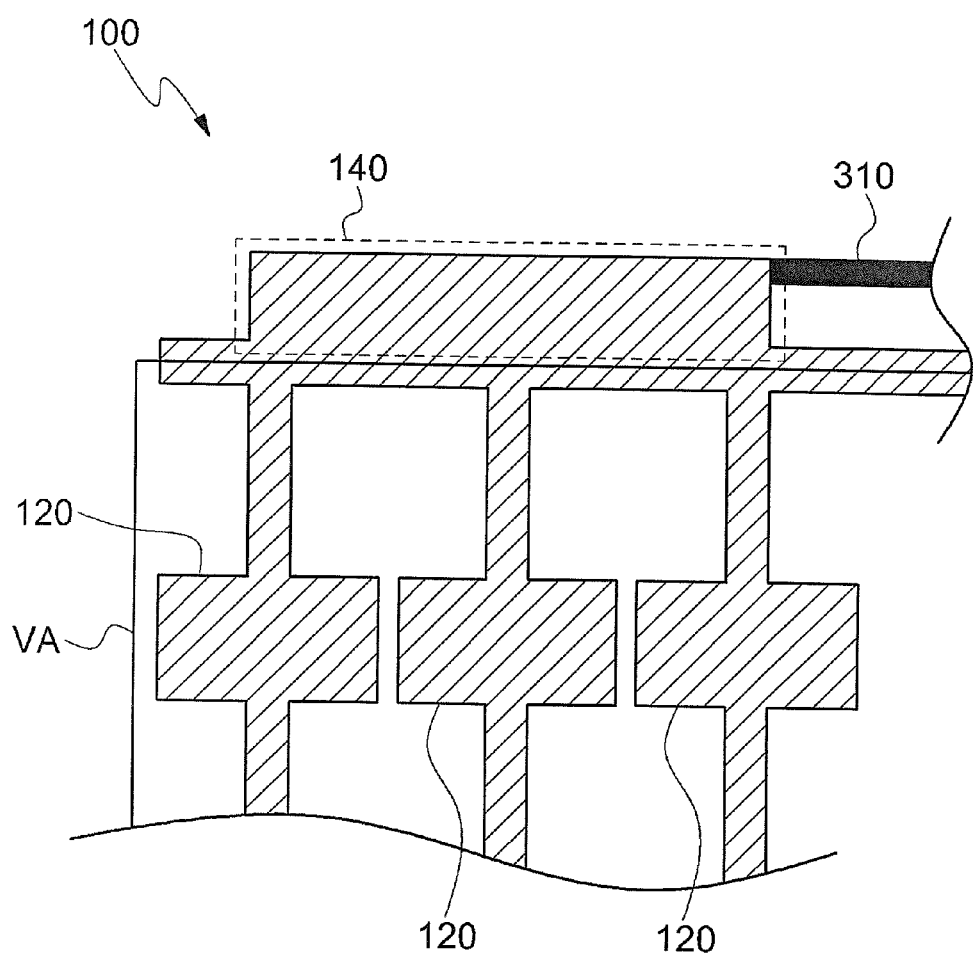
FIG. 2 is a plain view showing a part of an upper substrate included in a touch window according to the present invention.

FIG. 2 is a plain view showing a part of an upper substrate included in a touch window according to the present invention.

As shown in FIG. 2, the upper substrate 100 includes the first extension portion 140 from which the first transparent electrode having a first pattern 120 in one direction is extended to the outside of the boundary portion of the view area VA.

The first transparent electrode may be formed of one selected from ITO (Indium Tin Oxide), IZO (Indium Zinc Oxide), ZnO (Zinc Oxide), CNT (carbon nano tube), Ag Nano wire, conductive polymer and Graphene. Here, the first pattern 120 and the first extension portion 140 may be formed on the first transparent electrode through a patterning process such as etching, or the like.

The first pattern 120 may be shaped as at lest one of a circle, semicircle, quadrangle, polygonal, and lenticular form wherein the formed shapes are connected vertically and repeatedly. In the drawing, even though the first pattern 120 is shown in rectangular form; however, it is not limited thereto, and the first pattern may be shaped as a circle, semicircle, polygonal and lenticular form, or the like.

The first extension portion 140 may be formed along an outer side of the boundary portion of the view area VA.

As an embodiment, the first extension portion 140 may have same area as the inner area of the first transparent electrode formed on the boundary portion of the view area VA, or may have a larger area than that of the inner area of the first transparent electrode. The touch sensing degree may be differed depending on the area of the first extension portion 140 formed on the boundary portion of the view area VA.

For example, the first extension portion 140 may be formed along an upper side or a lower side of the boundary portion of the view area VA and thus when the upper side or the lower side are touched, the coordinate position of the boundary portion, corresponding to the touch, can be obtained. That is, according to the prior art, when the boundary portion of the view area VA, the coordinate position of the boundary portion is not recognized, and the coordinate position of the nearest inner side to the boundary portion is recognized and thus the practically touched position is different from the recognized coordinate position to lower the touch sensing degree. However, in the present invention, the first transparent electrode is extended to the boundary portion of the view area VA, and the first extension portion 140 of the extended first transparent electrode is touched to the boundary portion of the view area VA to obtain accurately the coordinate position of the boundary portion, thereby improving the touch sensing degree.

Further, a metal wire 310 may formed on one side of the first extension portion 140, which is connected to the first extension portion 140 and draws the touch signal, corresponding the touch, when the boundary portion of the view area VA is touched.

In addition, the upper substrate 100 may be made of one of PET (polyethylene terephtalete), PC (polycarbonate), PES (polyether sulfone), PI (polyimide) and PMMA (PolyMethly MethaAcrylate).

Figure 3:
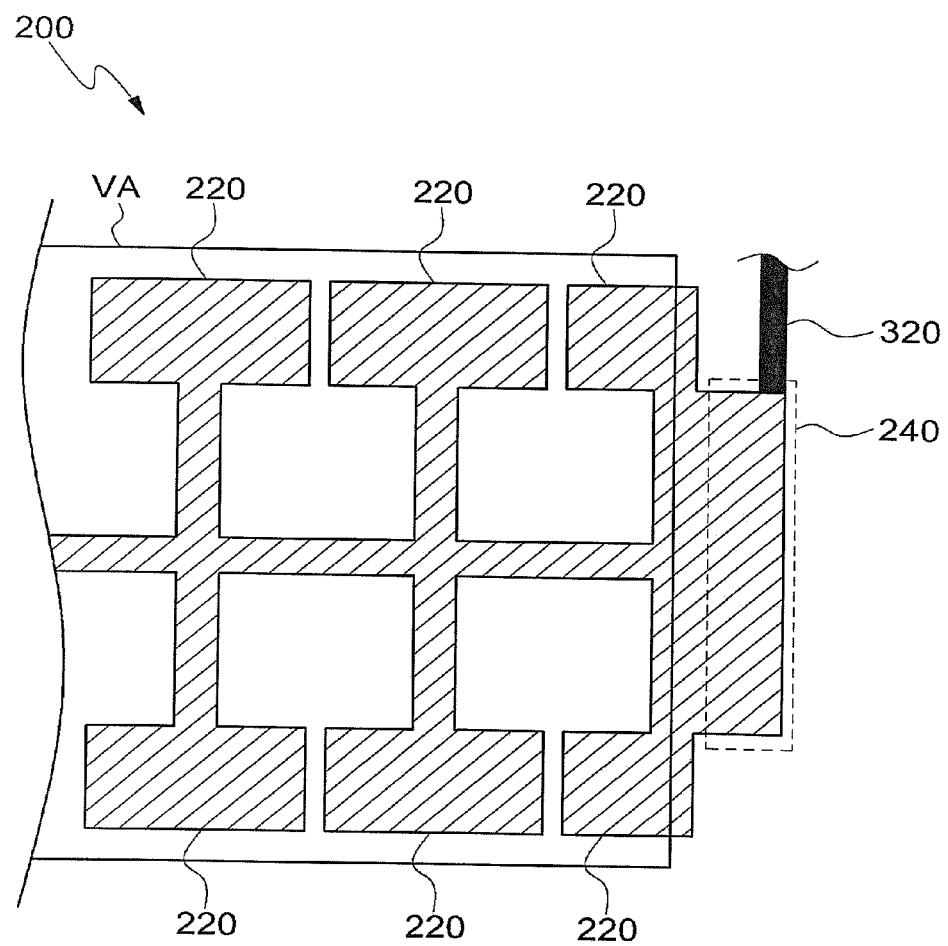
FIG. 3 is a plain view showing a part of a lower substrate included in a touch window according to the present invention.

FIG. 3 is a plain view showing a part of a lower substrate included in a touch window according to the present invention.

As shown in FIG. 3, the lower substrate 200 includes the second extension portion 240 from which the second transparent electrode having a second pattern 220 in orthogonal to the one direction is extended to the outside of the boundary portion of the view area VA of the orthogonal direction.

The second transparent electrode may be formed of one selected from ITO (Indium Tin Oxide), IZO (Indium Zinc Oxide), ZnO (Zinc Oxide), CNT (carbon nano tube), Ag Nano wire, conductive polymer and Graphene. Here, the second pattern 220 and the second extension portion 240 may be formed on the second transparent electrode through a patterning process such as etching, or the like, similar to the method of forming the upper substrate 100.

The second pattern 220 may be shaped as at lest one of a circle, semicircle, quadrangle, polygonal, and lenticular form, like the first substrate wherein the second substrate is orthogonal to the first substrate. Even though the second pattern 220 is shown in rectangular form, like the first substrate; however, it is not limited thereto, and the first pattern may be shaped as a circle, semicircle, polygonal and lenticular form, or the like.

The second extension portion 240 may be formed along an outer side of the boundary portion of the view area VA, like the first extension portion 140.

As an embodiment, the second extension portion 240 may have same area as the inner area of the second transparent electrode formed on the boundary portion of the view area VA, or may have a larger area than that of the inner area of the second transparent electrode. The touch sensing degree may be varied depending on the area of the second extension portion 240 formed on the boundary portion of the view area VA.

For example, the second extension portion 240 may be formed along a left side and a right side of the boundary portion of the view area VA and thus when the left side and the right side are touched, the coordinate position of the boundary portion, corresponding to the touch can be obtained.

Further, a metal wire 320 may formed on one side of the second extension portion 240, which is connected to the second extension portion 240 and draws the touch signal, corresponding the touch, when the boundary portion of the view area VA is touched.

In addition, the lower substrate 200 may be made of one of PET (polyethylene terephtalete, PC (polycarbonate), PES (polyether sulfone), PI (polyimide) and PMMA (PolyMethly MethaAcrylate).

In the present embodiment, a transparent adhering film is further included between the upper substrate 100 and the lower substrate 200 to adhere the upper substrate 100 and the lower substrate 200, and further a window layer (not shown) may be provided over the upper substrate 100 to protect the first transparent electrode from an external side.

Figure 4:
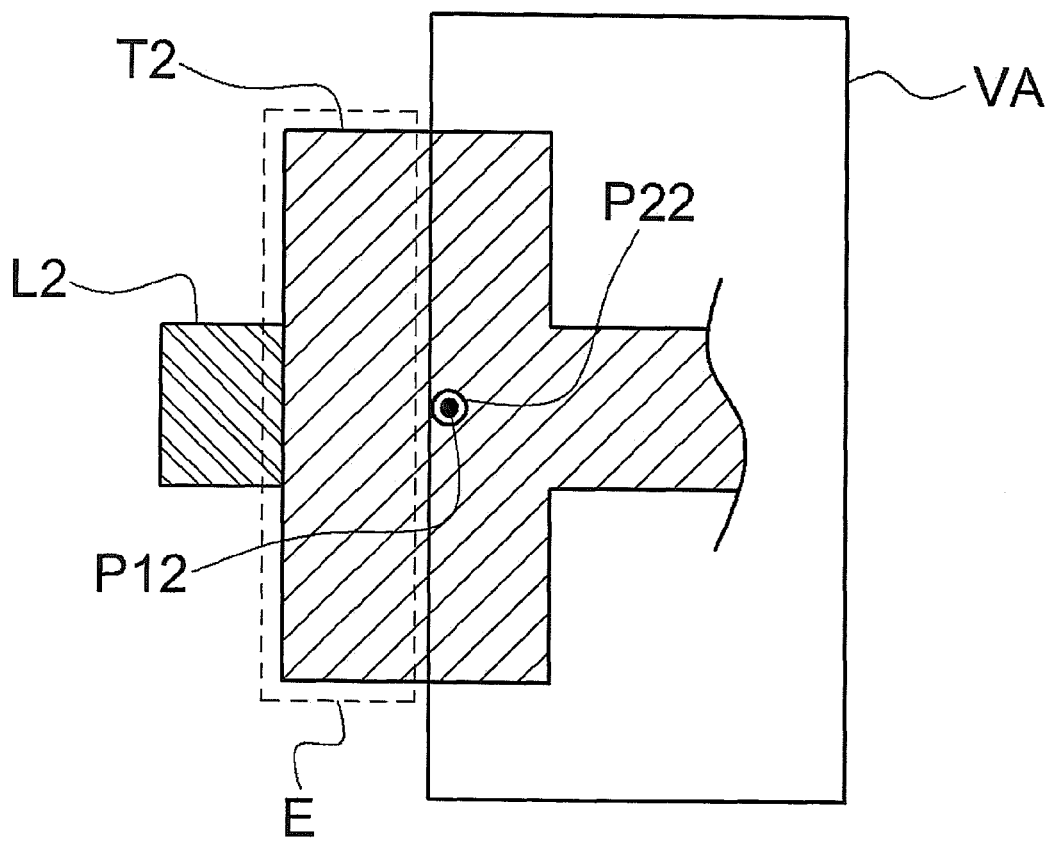
FIG. 4 is view showing an example for sensing a coordinate on a boundary portion of a view area in a touch window according to an embodiment of the present invention.

FIG. 4 is view showing an example for sensing a coordinate on a boundary portion of a view area in a touch window according to an embodiment of the present invention.

Referring to FIG. 4, in the touch window according to the present embodiment, an extension portion E from which a transparent electrode T2 is extended to an outer side of the boundary portion of the view area VA is formed to prohibit a decreasing of the sensing degree in the boundary portion of the view area VA and to remove the tilting of the coordinate. For reference, in FIG. 4, one example of the upper substrate and the lower substrate is described.

Comparing FIG. 4 to FIG. 1 of the prior art, in the prior art, as an area of the transparent electrode T1 decreases gradually from the boundary portion of the view area VA to an external part, a sensing degree is decreased to produce a coordinate tilting since the touch point P11 touched practically and the recognition point P21 differ. In this case, even when a user touches accurately the boundary portion of the view area on the portable terminal, or the like, the touch window does not obtain an accurate touch coordinate position.

However, in the touch window according to the present invention, the transparent electrode T2 is extended further to the outer side of the boundary portion of the view area VA to correspond the actual touch point P12 to the recognition point P22, thereby obtaining the accurate touch coordinate position.

According to an embodiment of the present invention, in the boundary portion of the view area, the touch coordinate position by a user is corresponded to the recognition coordinate position, thereby obtaining the accurate touch coordinate position.

According to another embodiment of the present invention, an area of the transparent electrode is enlarged to an outer side of the boundary portion of the view area to improve a touch sensing degree and to prohibit the coordinate tilting.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A touch window comprising:
   a first transparent electrode including:
   a plurality of first patterns in a first direction within a view area, and
   an inner side of the first transparent electrode formed in a second direction different from the first direction along a boundary portion of the view area;
   a first extension portion disposed at an outer side of the boundary portion of the view area and connected to the plurality of first patterns via the inner side of the first transparent electrode; and
   a first metal wire directly connected to the first extension portion and indirectly connected to the plurality of first patterns via the first extension portion.

2. The touch window of claim 1,
   wherein a second extension portion has a same area as an inner area of a second transparent electrode formed on the boundary portion of the view area in a direction orthogonal to the first direction.

3. The touch window of claim 1, wherein the second transparent electrode includes:
   a plurality of second patterns in a second direction within the view area, and
   an inner side of the second transparent electrode formed in second direction different from the first direction along the boundary portion of the view area.

4. The touch window of claim 3, wherein the first transparent electrode or the second transparent electrode is formed of one selected from ITO (Indium Tin Oxide), IZO (Indium Zinc Oxide), ZnO (Zinc Oxide), CNT (carbon nano tube), Ag Nano wire, conductive polymer and Graphene.

5. The touch window of claim 3, wherein the first transparent electrode is formed on an upper substrate, and the second transparent electrode is formed on a lower substrate, and wherein the upper substrate or the lower substrate is made of one of PET (polyethylene terephtalete), PC (polycarbonate), PES (polyether sulfone), PI (polyimide) and PMMA (Poly-Methly MethaAcrylate).

6. The touch window of claim 3, further comprising a second extension portion disposed at the outer side of the boundary portion of the view area and connected to the plurality of second patterns via the inner side of the second transparent electrode.

7. The touch window of claim 6, further comprising a second metal wire directly connected to the second extension portion.

8. The touch window of claim 7, wherein the second metal wire is formed along the boundary portion of the view area.

9. The touch window of claim 1, wherein a first pattern of the plurality of first patterns has a shape of at least one of a circle, semicircle, quadrangle, polygonal, and lenticular form.

10. The touch window of claim 9, wherein a first pattern of the plurality of second patterns has a same shape as that of the plurality of first patterns.

11. The touch window of claim 1, wherein the first metal wire is formed along the boundary portion of the view area.

12. The touch window of claim 1, wherein the plurality of first patterns is substantially orthogonal to the plurality of second patterns.

* * * * *